United States Patent [19]

Suzuki

[11] Patent Number: 5,761,798
[45] Date of Patent: Jun. 9, 1998

[54] SYSTEM AND A METHOD FOR MOUNTING ELECTRONIC COMPONENTS

[75] Inventor: Naoki Suzuki, Shamamatsu, Japan

[73] Assignee: Samsung Aerospace Industries, Ltd., Kyungsangnam-do, Rep. of Korea

[21] Appl. No.: 603,127

[22] Filed: Feb. 20, 1996

[30] Foreign Application Priority Data

Feb. 21, 1995 [JP] Japan ................................ 7-032238

[51] Int. Cl.$^6$ .............................. B23P 19/00; H05K 3/30
[52] U.S. Cl. ................................ 29/832; 29/743; 29/7
[58] Field of Search ........................... 29/743, 740, 741, 29/712, 703, 593, 832, 834, 836; 414/737, 752

[56] References Cited

U.S. PATENT DOCUMENTS

| | | | |
|---|---|---|---|
| 4,683,654 | 8/1987 | Scholten et al. | 29/740 |
| 5,029,383 | 7/1991 | Snyder et al. | 29/743 |
| 5,475,619 | 12/1995 | Sugano et al. | 414/737 |
| 5,498,942 | 3/1996 | Ijuin | 29/743 |

*Primary Examiner*—P. W. Echols
*Attorney, Agent, or Firm*—Finnegan, Henderson, Farabow, Garrett & Dunner, L.L.P.

[57] ABSTRACT

A system and a method for mounting electronic components on a printed circuit board are disclosed. The system comprises a component supporting stage, a board bearing stage, mounting heads, vacuum bits, pressure sensors, device for computing thresholds, and device for determining the status of the pick-up operation of the vacuum bits. The method comprises the steps of detecting a first pressure value of a vacuum bit at which the vacuum bit is open and a second pressure value of the vacuum bit at which the vacuum bit is closed, computing a threshold value in response to the detected first and second pressure values, and moving the mounting heads to the board bearing stage in response to a determination that the pressure value of the vacuum bit at which the component is picked up exceeds the threshold values.

4 Claims, 4 Drawing Sheets

SYSTEM AND A METHOD FOR MOUNTING ELECTRONIC COMPONENTS

BACKGROUND OF THE INVENTION

1. Field of the Invention

The present invention relates to a technique for automatically mounting electronic components on a board, such as a printed circuit board.

2. Description of the Prior Art

A fully automatic mounting system may be used in mounting semiconductor devices such as integrated circuit, large scale-integrated circuit, diodes, condensers, resistors, and other small electrical units on a printed circuit board.

The above mounting system includes guide rails that guide a printed circuit board (PCB) and define positions of the PCB onto a board bearing stage, component supporting stages for holding several kinds of electronic components to be mounted onto the PCB, and mounting heads moving horizontally in the direction of an X-axis and Y-axis for carrying the electronic components from the component supporting stages to the PCB for mounting the components. Each mounting head has vacuum bits, i.e. adsorption nozzles, which moves up and down over the board bearing stage and component supporting stages. A plurality of vacuum bits are supported by a bit sustainer or in other words a bit holder that allows the vacuum bits to be selected and replaced and predetermined vacuum bit to be installed to the mounting head according to the size and variety of electronic components to be mounted on the PCB.

The vacuum bits are connected to a vacuum pump which causes a passage or hollow inside of the vacuum bit to be maintained at a certain negative atmosphere pressure so that the vacuum bit may hold an electronic component by vacuum. In order to automatically detect whether the vacuum bit picks up the part or not, each vacuum bit has a pressure sensor that senses the pressure value of the nozzle hole or hollow.

The inside of the hollow is kept at substantially atmospheric pressure when the vacuum bit holds nothing, and the hollow attains subatmospheric pressure whenever the vacuum bit picks up or is holding the electronic component. Therefore, the pressure sensor detects the pressure value that is either close to or lower than the predetermined pressure to find out the status of the vacuum bit with respect to the electronic component.

The vacuum bits of the bit holder are different from each other in diameter and there is difference in pressure at which the electronic components are held to the respective vacuum bits.

If the pressure at which the vacuum bits pick up components is previously determined at a certain level, the pressure sensor detects whether that vacuum bit is correctly picking up the component. However, if the first vacuum bit is replaced with another vacuum bit, the latter vacuum bit does not hold the component at the same predetermined pressure as the first vacuum bit. In addition, each vacuum bit has varying adsorbing pressure levels depending upon the mounting condition with respect to the mounting head.

When the pressure sensor detects that and electronic component is not held by the vacuum bit during the pick-up operation, the mounting head does not move the board bearing stage but rather toward an outlet and the vacuum bit is provided with constant pressure. This mounting system is designed to take into consideration a malfunction of the pressure sensor, i.e., a possibility that an electronic component is actually held by the vacuum bit even though the pressure sensor does not detect the vacuum bit picking up the component. Such errors may waste electronic components and adversely affect assembly performance of electronic components.

SUMMARY OF THE INVENTION

Accordingly, the present invention encompasses a system and method for mounting electronic components that ensures correct detection of the pick-up condition of the vacuum bit.

The present invention provides a method for mounting electronic components on a printed circuit board with a system having component supporting stages for holding the electronic components with mounting heads with detachable vacuum bits to pick up the electronic components and a board bearing stage for holding the printed circuit board, the method comprising the steps of detecting a first pressure value of a respective vacuum bit at which the respective vacuum bit is in an opening state; detecting a second pressure value of the respective vacuum bit at which the respective vacuum bit is in a closed state; determining a threshold value in response to the detected first and second pressure values of the respective vacuum bit; and moving the mounting heads to the board bearing stage in response to a determination that the pressure value of the vacuum bit at which the electronic component is picked up exceeds the threshold value.

In another aspect, the present system for mounting electronic components on a printed circuit board includes a component supporting stage for holding the electronic components with mounting heads with detachable vacuum bits to pick up the electronic components; a board bearing stage for holding the printed circuit board where the electronic components are mounted; a pressure sensor for detecting a first pressure value of a respective vacuum bit at which the respective vacuum bit is in an opening state, and a second pressure value of the respective vacuum bit at which the respective vacuum bit is in a closed state; means for determining a threshold value in response to the detected first and second pressure values of the respective vacuum bit; and means for moving the mounting heads to the board bearing stage in response to a determination that the pressure value of the vacuum bit at which the electronic component is picked up exceeds the threshold value.

DESCRIPTION OF THE PREFERRED EMBODIMENT

Reference will now be made in detail to a preferred embodiment of the present invention, examples of which are illustrated in the accompanying drawings FIGS. 1 to 4.

Figure 1:
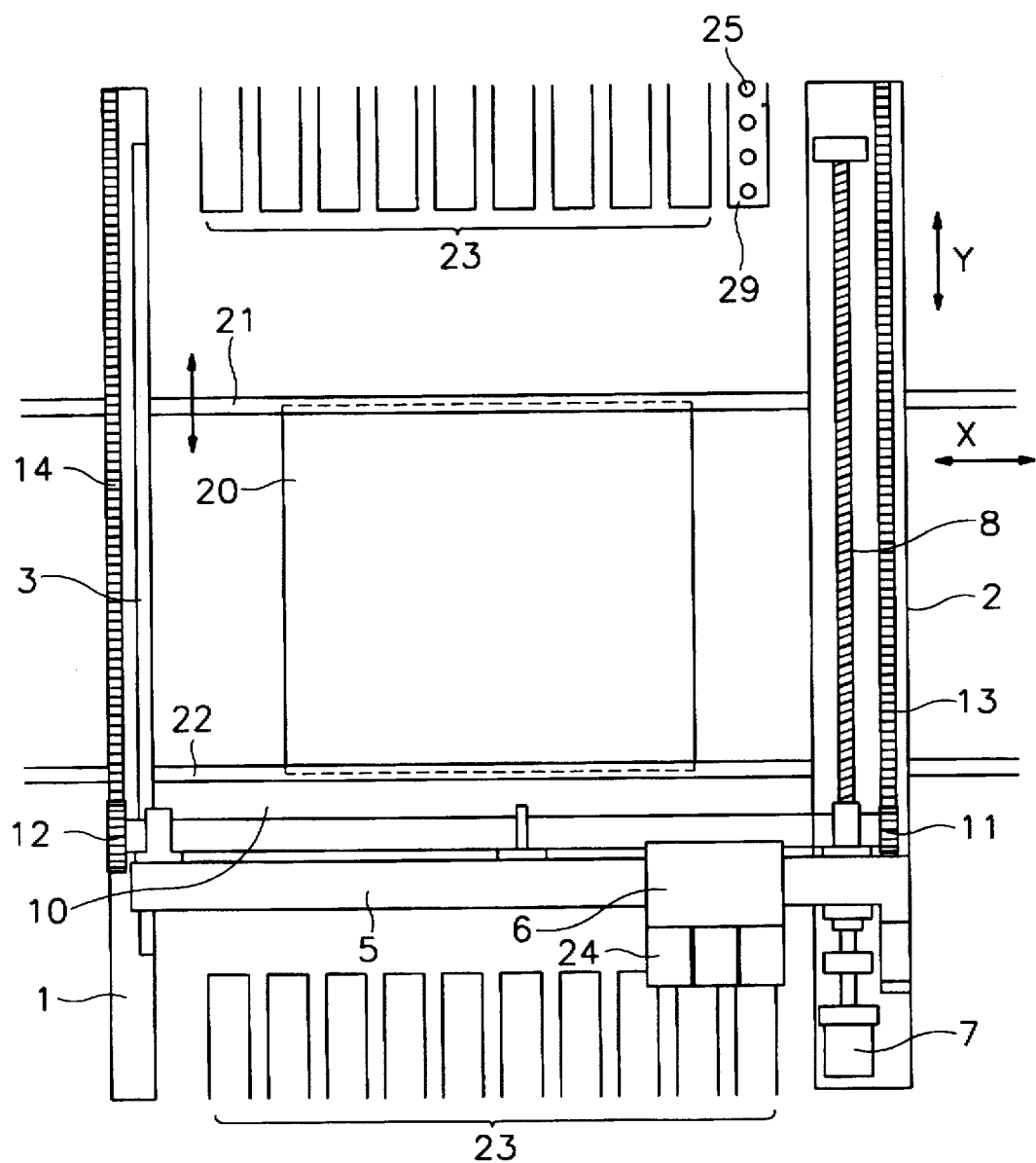
FIG. 1 is a schematic plan view of a system for mounting electronic components in accordance with a preferred embodiment of the present invention.
Figure 2:
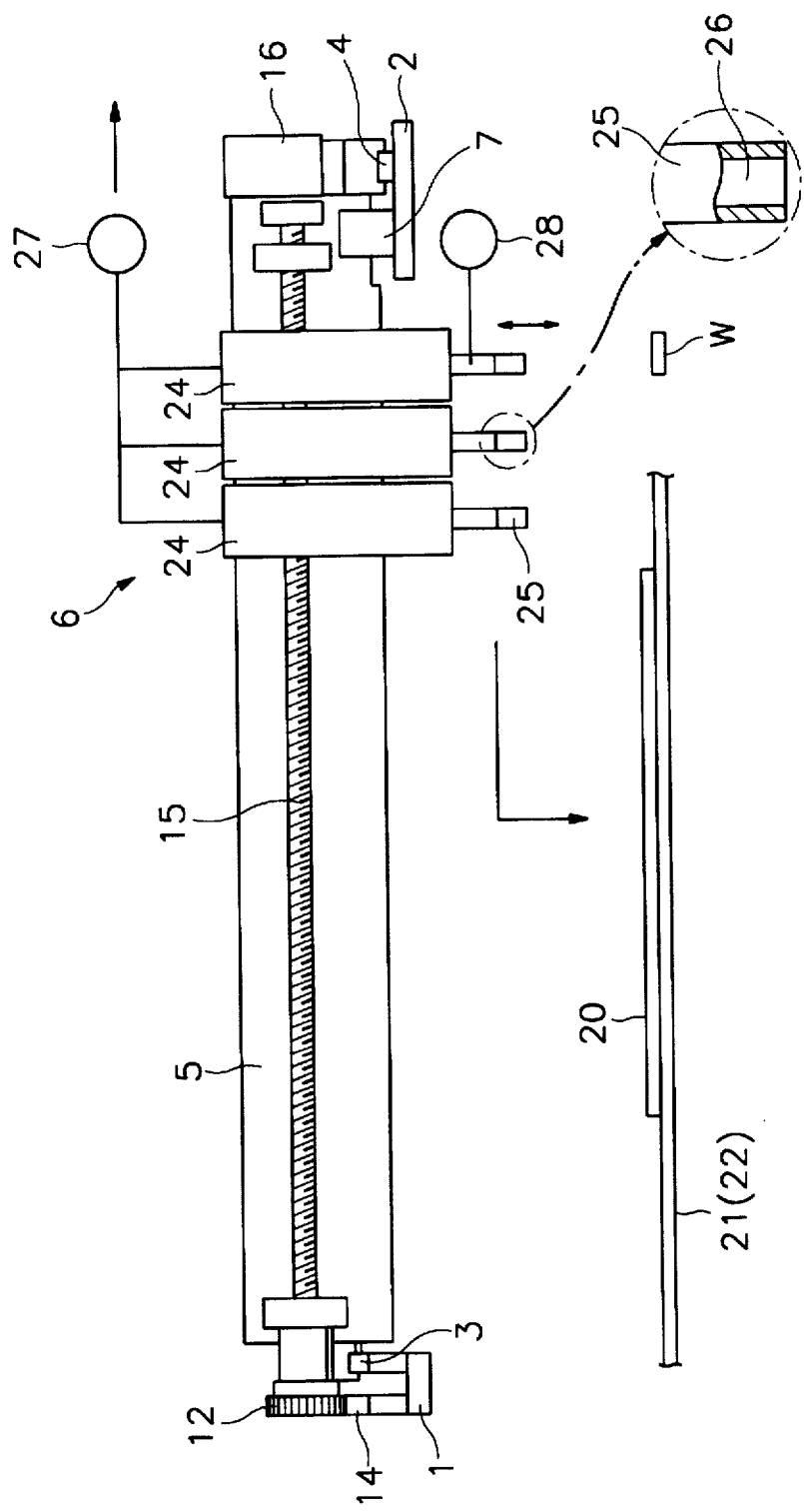
FIG. 2 is a schematic front view of the system shown in FIG. 1.

Referring to FIGS. 1 and 2, the electronic component mounting apparatus has a pair of main supports 1 and 2 disposed in parallel and guide rails 3 and 4 combined with the main supports 1 and 2, respectively. Orthogonal to the main supports 1 and 2, a cross-bar 5 whose end portions are respectively coupled to the guide rails 3 and 4 is guided in the Y-axis direction along the main supports 1 and 2. A head unit 6 is slidably coupled on a cross-bar 5 to move in the X-axis direction.

To move the cross-bar 5 in the Y-axis direction, a ball screw 8 driven by a motor 7 is rotatably combined with the main support 2. The ball screw 8 is threaded with an end portion of the cross-bar 5. An interlocking shaft 10 is installed to the cross-bar 5 in parallel with the cross-bar 5. Pinion gears 11 and 12, being fixed to either end of the interlocking shaft 10, engage rack gears 13 and 14 fixed to the main supports 2 and 1, respectively. Therefore, when the ball screw 8 is driven by the motor 7, the cross-bar 5 moves in the Y-axis direction. Then, the pinion gears 11 and 12 engaged with the rack gears 13 and 14 rotate, thus moving the cross-bar 5 in the Y-axis direction at right angles with respect to the main supports 1 and 2.

A ball screw 15 is rotatably installed to the cross-bar 5 to move a head unit 6 in the X-axis direction. The ball screw 15 is threaded with the head unit 6 and may be driven by a timing belt (not shown) travelling over a pulley (not shown) installed on the shaft of a motor 16 and a pulley (not shown) installed at the ball screw 15.

A pair of guide members 21 and 22 are installed in parallel under the main supports 1 and 2 extending orthogonally with respect to the guide members. The guide members 21 and 22 form a conveyer for transferring a printed circuit board (PCB) 20. The PCB 20 is guided to a predetermined position on a board supporting stage (not shown) by the guide members 21 and 22. The guide member 21 can move toward and away from the guide member 22, according to the size of the PCB 20.

A plurality of component stages 23 for supporting various electronic components are provided on both sides of the conveyer formed by the guide members 21 and 22. A plurality of mounting heads 24 are installed on the head unit 6 to mount the component of each component stage 23 on the PCB 20.

As shown in FIG. 2, a mounting head 24 has a vacuum bit 25 (nozzle) which can move up and down. The vacuum bit 25 picks up a component from the component stage 23 and mounts the component at a predetermined position on the PCB 20 by moving the cross-bar 5 along the main supports 1 and 2 in the Y-axis direction and by simultaneously moving the mounting head 24 along the cross-bar 5 in the X-axis direction. To pick up the component, the vacuum bit 25 first moves downward towards the component stage 23, and then upward and to the predetermined position of the PCB 20. Thereafter, by lowering the vacuum bit 25, the component is mounted at the predetermined position on the PCB 20.

Figure 3:
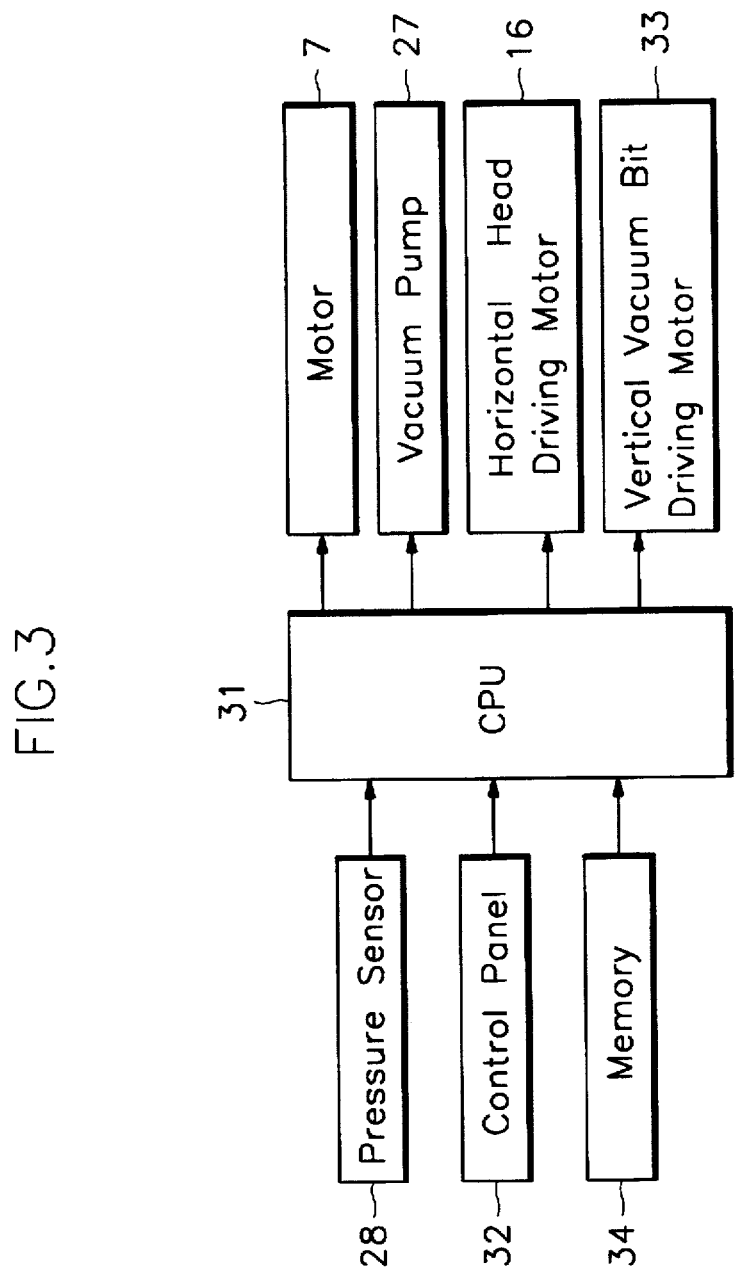
FIG. 3 is a block diagram of a control circuit for the system shown in FIG. 1.

The vacuum bit 25 has a nozzle hole 26 communicating with a vacuum pump 27. The component is picked up and held against the end of the vacuum bit 25 by vacuum pressure provided by the vacuum pump 27 through the nozzle hole 26. A pressure sensor 28 is provided to detect the pressure at the nozzle hole 26, which approximates atmospheric pressure when the vacuum bit 25 is free of the component and, using the vacuum pump 27, is set at a predetermined level below atmospheric pressure whenever the vacuum bit 25 holds a component. Although FIG. 2 shows one pressure sensor 28 installed only in a single mounting head 24, same pressure sensors are in fact provided for each mounting head FIG. 3 is a block diagram of a control circuit for the present system for mounting electronic components. Detecting signals produced from the pressure sensor 28 are input into a central processing unit 31 of the control circuit through an analog-digital converter or interface. A command signal is generated by a control panel 32 and transmitted to the CPU 31. The CPU 31 then generates and transmits control signals to the motor 7 for driving the vacuum pump 27 and moving the cross bar 5 in the Y-axis direction to the horizontal head driving motor 16 for driving the head unit 6 in the X-axis direction, and to a vertical vacuum bit driving motor 33 for moving the vacuum bit up and down.

A storage medium, such as a read-only-memory (ROM) storing a process for controlling the above-mentioned motors and a random-access-memory (RAM) for recording the control information, is provided either internally or external to the CPU 31. One of a plurality of vacuum bits 25 is used according to the size or variety of electronic components W to pick up, and are supported by a bit holder 29 shown in FIG. 1. The selected vacuum bit 25 appropriate for the electronic component W to be mounted, and is then provided to the mounting head 24 according to the electronic component W.

Since the pressure inside of hollows varies among the vacuum bits 25, when picking up electronic components, the vacuum bits 25 are moved to a test member disposed at a predetermined position, with the hollows closed, before one of the vacuum bits 25 is selected and mounted to the mounting head 24. The pressure value at which the vacuum bit 25 is closed is detected by the pressure sensor 28 and transmitted to the CPU 31 to be recorded externally or internally in the incorporated memory 34. Likewise, the pressure value at which the vacuum bit 25 is open is also detected by the pressure sensor 28 is stored in the memory 34.

In accordance with the above pressure values, the CPU 31 determines a threshold value at which the vacuum bit 25 securely holds the electronic component W. One of ordinary skill will appreciate that there are numerous ways to determine such a threshold value. The threshold values are stored in the memory 34. The threshold values corresponding to the vacuum bit 25 are provided to the mounting head 24 before a pick-up operation is carried out.

Figure 4:
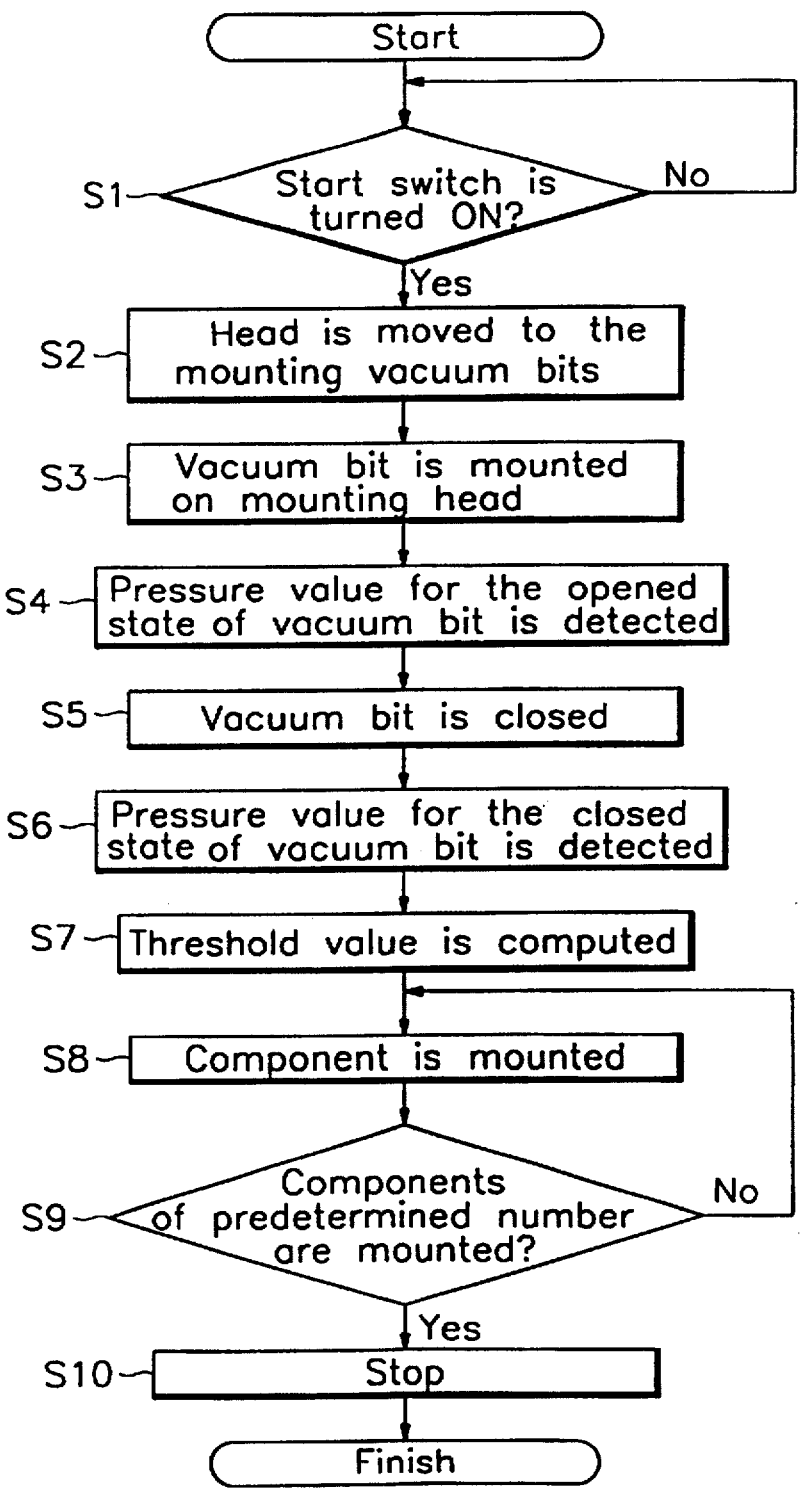
FIG. 4 is a flow chart of the operation of the system shown in FIG. 1.

FIG. 4 depicts the steps operating the present system for mounting electronic components in accordance with a preferred embodiment of the present invention.

When a start switch of the control panel 32 is turned on (S1), the mounting head or heads 24 are moved to the bit holder 29 of FIG. 1 (S2).

The vacuum bit 25 of the mounting head 24 moves to the predetermined component stage 23 by simultaneously moving the cross-bar 5 in the Y-axis direction and the mounting head 24 along the cross-bar in the X-axis direction. Here, the hollow rod 40 advances downwardly or, descends by the driving force of the motor 45, such that the vacuum bit 25 makes contact with the component. The component is then picked up and held against the vacuum bit 25 by vacuum pressure provided by the vacuum pump 27.

The end of the vacuum bit 25 that is being mounted on the mounting head 24 is not opened and while driving the vacuum pump 27, the pressure value at which the vacuum bit 25 is in the opened state is detected by the pressure sensor 28 (S4) and input into the memory 34. The closing operation of the vacuum bit 25 is then carried out (S5). Thereafter, the vacuum bit 25 is moved to a test area formed with a predetermined degree of flatness and the vacuum bit 25 is shifted downward and then closed. At this point, the pressure value at which the vacuum bit 25 is in the closed state is detected (S6) by the pressure sensor 28. The pressure sensor 28 determines the status of a pick-up operation of the vacuum bit 25 according to the detected pressure values at which the vacuum bit 25 is in the opened and closed states. A threshold pressure value is determined by the CPU 31 (S7) and stored in the memory 34, thereby completing the preparation for mounting electronic components.

When the head unit has three mounting heads 24, as shown in FIG. 1, three sets of threshold values for each vacuum bit 25 mounted on the mounting head 24 are computed. All of predetermined electronic components are mounted on the PCB 20 (S8). When the mounting is completed for the PCB 20, a new printed circuit board without mounted electronic components is transferred by the guide members 21 and 22 to a predetermined position of the board bearing stage. If the pressure sensor 28 detects a negative pressure value beyond a predetermined threshold even though the pick-up operation is carried out, it might be an erroneous operation. The mounting heads 24 are returned to a position of waste, and the vacuum condition is released.

If the CPU 31 determines (S9) that the operation for mounting electronic components of a different type on a new printed circuit board, after completing the steps for mounting electronic components of the same type as the former ones on the PCB, the mounting operation is stopped at S10. Preferably, computation of a threshold values of the respective vacuum bits 25 is carried out every time the vacuum bits 25 are mounted on the mounting heads 24, and such computation may also be performed every time the process for mounting a predetermined number of electronic components W is completed, in case negative pressure is varied with repetition of the pick-up operation.

As mentioned above, as the threshold value of each vacuum bit 25 is detected by the corresponding pressure sensor 28 with high precision, it is possible to prevent misjudgment or miscalculation of the pick-up condition of the vacuum bits 25. Accordingly, the present system avoids any erroneous operation during the mounting steps electronic components on a printed circuit board, and enhances component-mounting efficiency as well as production yield.

The preferred embodiment of the present invention is given by way of example, and the invention recited in the attached claims is not limited to the illustrated embodiment. Those of ordinary skill in the art will recognize that design changes may be made to the exemplary embodiment without departing from the scope of the claims.

What is claimed is:

1. A method for mounting electronic components on a printed circuit board, for use with a system having a central processing unit, at least one component supporting stage for holding the electronic components, at least one mounting head including a detachable vacuum bit operable between open and closed states for picking up the electronic components, a vacuum pump in communication with the at least one vacuum bit, and a board bearing stage for holding the printed circuit board, the method comprising:

energizing the vacuum pump so as to create a vacuum within the at least one vacuum bit;

detecting a first pressure value associated with the vacuum within the at least one vacuum bit while the vacuum bit is in an open state;

detecting a second pressure value associated with the vacuum within the at least one vacuum bit while the vacuum bit is in a closed state;

determining, by the central processing unit based on the detected first and second pressure values, a threshold pressure value indicating the pressure at which an electronic component is securely held to the vacuum bit;

moving the at least one mounting head to the at least one component supporting stage to attempt a pick up of an electronic component; and moving the at least one mounting head to the board bearing stage in response to a determination that the pressure of within the vacuum bit at which the electronic component is picked up exceeds the threshold pressure value in order to deposit the electronic component onto the printed circuit board.

2. The method of claim 1 further comprising the step of moving the vacuum bit to a test area having a predetermined degree of flatness before the second pressure value is detected.

3. A system for mounting electronic components on a printed circuit board, comprising:

at least one component supporting stage for holding the electronic components;

at least one mounting head including a detachable vacuum bit operable between open and closed states for picking up the electronic components;

a board bearing stage for holding the printed circuit board;

a vacuum pump for creating a vacuum within the at least one vacuum bit;

a pressure sensor for detecting a first pressure value associated with the vacuum within the at least one vacuum bit while the vacuum bit is in an open state, and a second pressure value associated with the vacuum within the at least one vacuum bit while the vacuum bit is in a closed state;

means for determining, based on the detected first and second pressure values, a threshold pressure value indicating the pressure at which an electronic component is securely held to the vacuum bit;

means for moving the at least one mounting head to the at least one component supporting stage to attempt a pick up of an electronic component; and means for moving the at least one mounting head to the board bearing stage in response to a determination that the pressure within the vacuum bit at which the electronic component is picked up exceeds the threshold pressure value and depositing the electronic component onto the printed circuit board.

4. The system of claim 3 wherein the vacuum bit is mounted on the mounting head and wherein the vacuum bit is moved to a test area disposed at a predetermined position before the vacuum bit is mounted on the mounting head.

* * * * *

UNITED STATES PATENT AND TRADEMARK OFFICE
CERTIFICATE OF CORRECTION

PATENT NO.    :   5,761,798
DATED         :   June 9, 1998
INVENTOR(S)   :   Naoki SUZUKI It is certified that error appears in the above-indentified patent and that said Letters Patent is hereby corrected as shown below:

Claim 1, col. 6, line 18, after "pressure", delete "of".

Signed and Sealed this

Twenty-second Day of June, 1999

Attest:

*Attesting Officer*

Q. TODD DICKINSON

*Acting Commissioner of Patents and Trademarks*